United States Patent [19]

Evans

[11] 3,941,448

[45] Mar. 2, 1976

[54] CONNECTOR BLOCK

[75] Inventor: Robert F. Evans, New Cumberland, Pa.

[73] Assignee: E. I. Du Pont de Nemours & Company, Wilmington, Del.

[22] Filed: July 29, 1974

[21] Appl. No.: 492,731

[52] U.S. Cl. .................... 339/176 MF; 339/176 MP

[51] Int. Cl.$^2$ .......................................... H05K 1/07

[58] Field of Search. 339/17 R, 17 M, 17 P, 17 LM, 339/17 LC, 75 MP, 176 MP, 176 MF

[56] References Cited

UNITED STATES PATENTS

| | | | |
|---|---|---|---|
| 3,154,365 | 10/1964 | Crimmins | 339/176 MP |
| 3,218,603 | 11/1965 | Sanislo | 339/176 |
| 3,307,139 | 2/1967 | Prise | 339/176 MF |
| 3,360,767 | 12/1967 | Brown et al. | 339/176 MP |
| 3,504,330 | 3/1970 | Holzhaeuser | 339/17 L |

*Primary Examiner*—Roy Lake
*Assistant Examiner*—Neil Abrams
*Attorney, Agent, or Firm*—Thomas Hooker

[57] ABSTRACT

A connector block having a first slot extending from one face in a direction for receiving the edge of a circuit board, a second slot extending from a second face in a direction opposite to the first slot and past the first slot for receiving a nose with a ribbon cable wrapped around the nose, openings in the body portion between the slots and contact terminals confined within such openings such that insertion of the nose and ribbon cable into the second slot and insertion of the circuit board into the first slot stresses the contacts between the nose and board and forms electrical interconnections therebetween.

8 Claims, 9 Drawing Figures

Fig. 7
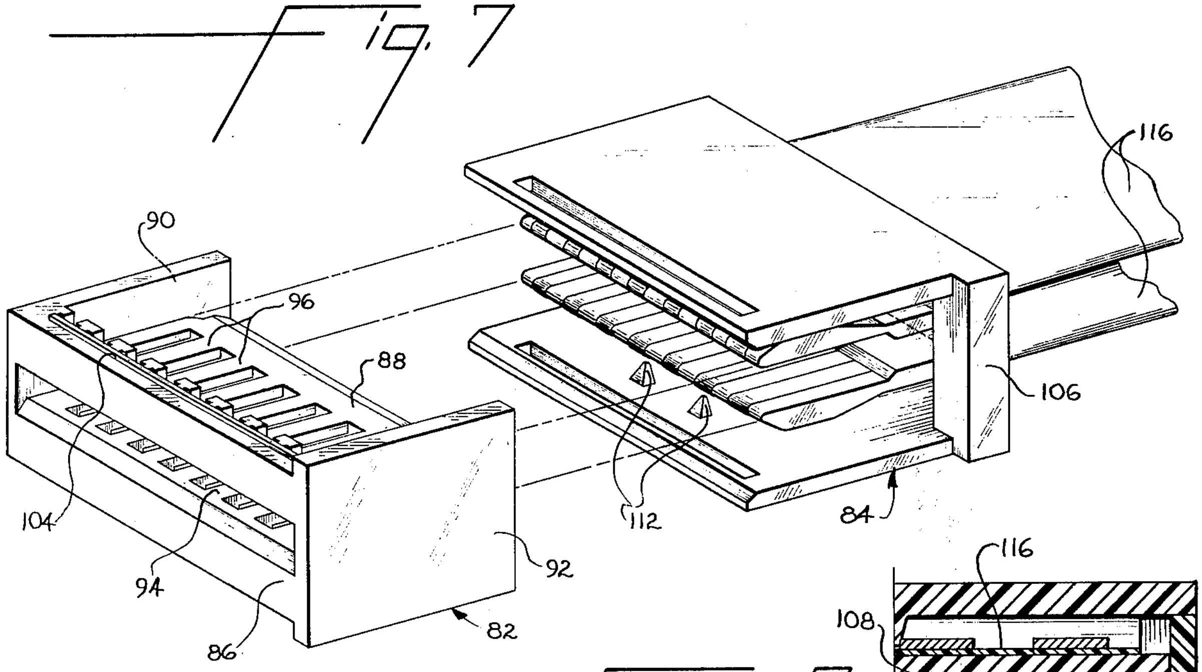
Fig. 9
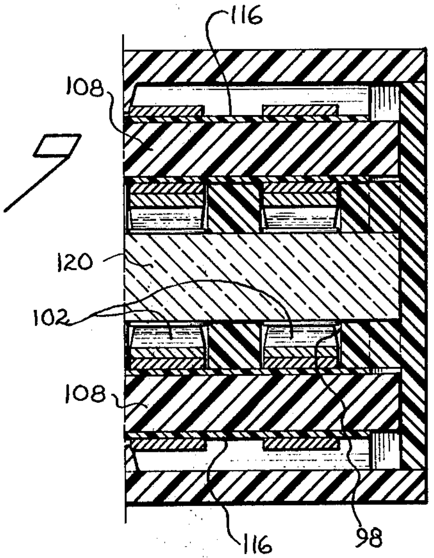
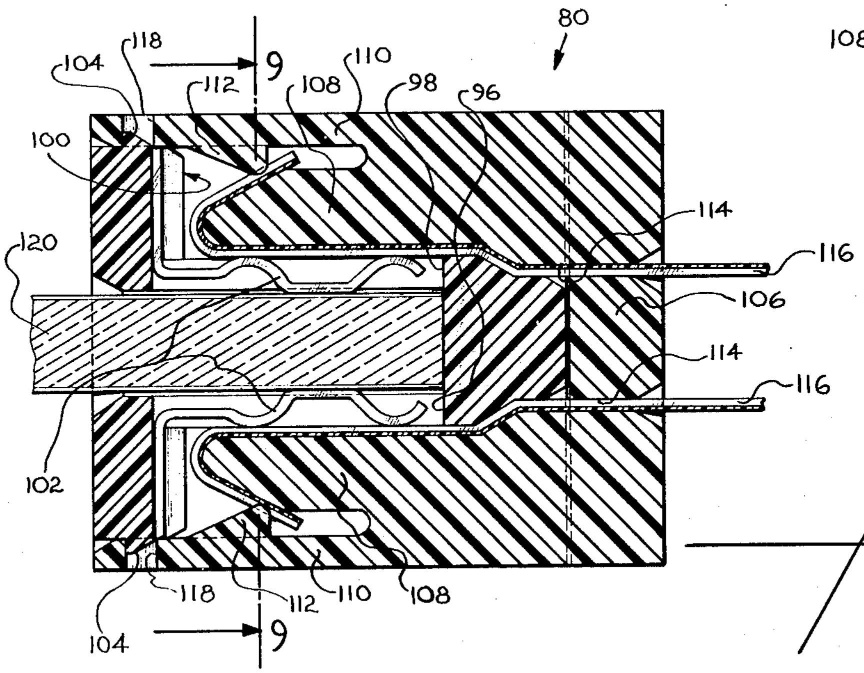
Fig. 8

CONNECTOR BLOCK

The invention relates to connector blocks for forming electrical connections between the flat thin conductors of a ribbon cable and contact pads on one side of a circuit board where the conductors and pads are arranged in the same lateral spacing. The block body includes a pair of slots extending in opposite directions from front and rear faces past each other. Metal spring contacts are confined in openings between two slots. A nose with a ribbon cable wrapped around the nose and conductors exposed on the nose is inserted into one of the slots and lightly engages the spring contacts. Subsequent insertion of a circuit board into the other slot stresses the spring contacts to form reliable interconnections through the contacts between the pads on the board and the exposed conductors on the cable. The body of the block includes a pair of members assembled together and having meeting faces defining a stress relief sandwich connection with the cable so that when assembled the members tightly sandwich a portion of the cable away from the nose and impart a pair of shallow opposite direction bends in the cable, thus isolating the cable bent around the nose from stresses exerted on the exposed portion of the cable extending from the block. In this way, the block is secured to the cable and the delicate cable conductors in the block are protected from external stresses tending to rupture or injure them.

The interconnecting metal contacts isolate the ribbon cable conductors from lateral frictional forces during insertion of the circuit board. Insertion of that circuit board increases the normal force or contact pressure between the ribbon cable conductors and the initial contacts without injury to the conductors.

In both disclosed embodiments, the conductors of two ribbon cables are connected to contact pads on both sides of a circuit board. One embodiment of the invention includes mounting openings extending through the body to permit movement of the metal contacts from top and bottom body surfaces through one of the openings to a position between the slots. This permits rapid and economic assembly of the contacts in the block and further provides a visual inspection opening to ascertain the location of the ribbon cable conductors on the nose, when the body parts are assembled.

U.S. Pat. Nos. 3,176,261; 3,218,603; and 3,504,330 disclose connector blocks in which interconnecting contacts are used for forming electrical connections between contact members. These patents are not directed to the problem of forming reliable electrical connections between flat, delicate connectors of ribbon cables and contact pads on a circuit board or like member.

Other objects and features of the invention will become apparent as the description proceeds, especially when taken in conjunction with the accompanying drawings illustrating the invention, of which there are three sheets.

IN THE DRAWINGS

FIG. 7 is a perspective view similar to FIG. 1 of a second embodiment of the invention;

FIG. 8 is a sectional view through the block of FIG. 7 after assembly of the two block members and insertion of the circuit board; and FIG. 9 is a sectional view taken along line 9—9 of FIG. 8.

Figure 2:
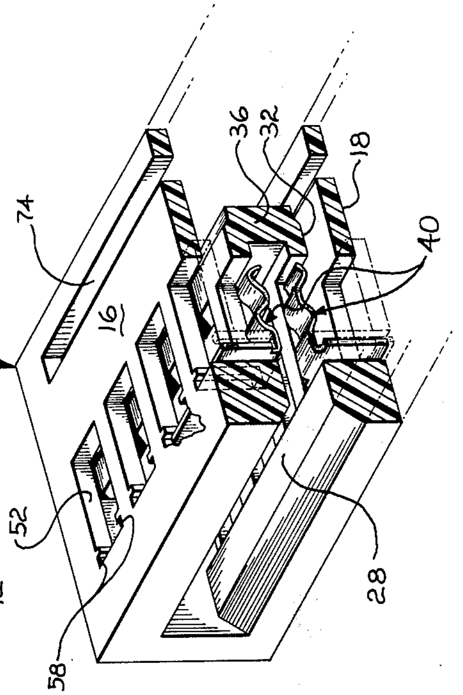
FIG. 2 is a sectional view of one of the members making up the body of the connector block.
Figure 3:
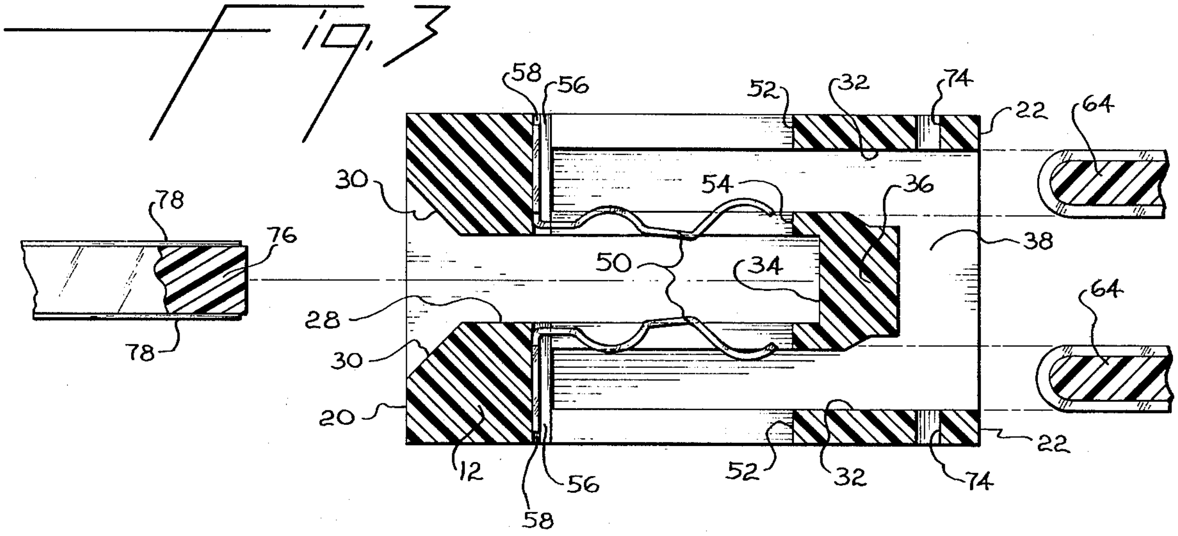
FIGS. 3 and 4 are sectional views taken through such block member prior to and subsequent to assembling the two block members and inserting the circuit board.
Figure 4:
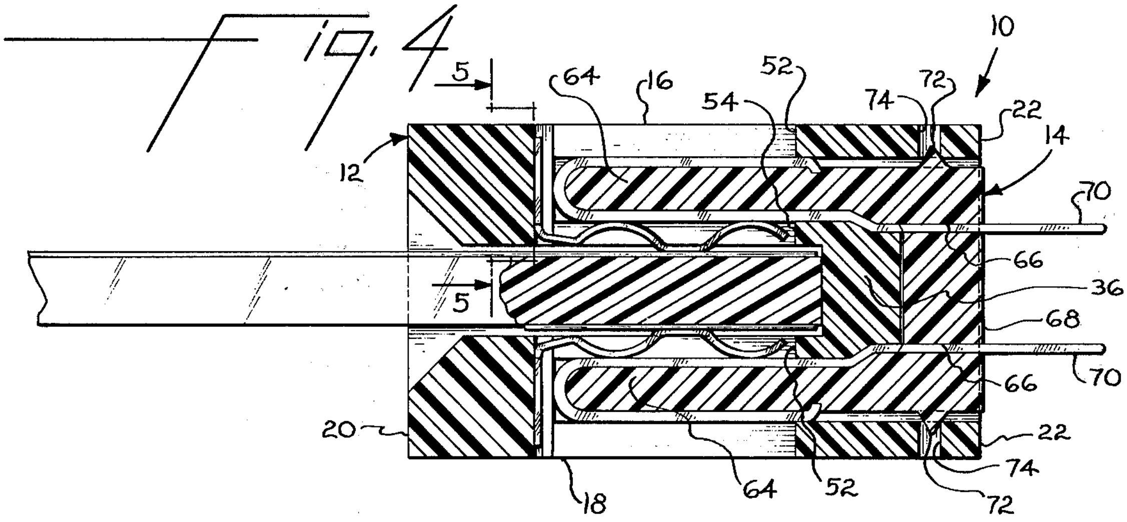
Figure 5:
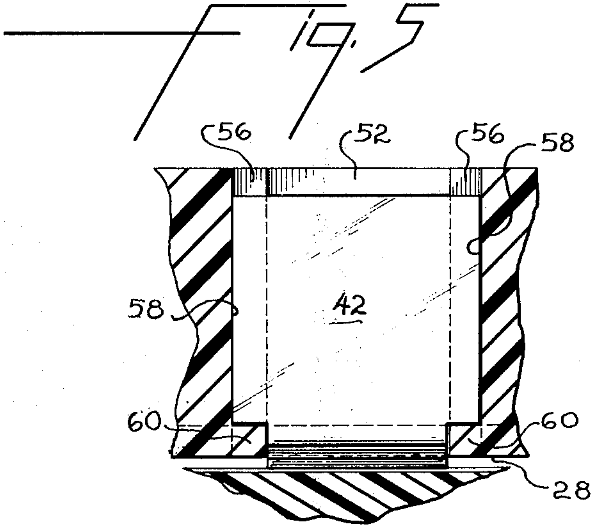
FIG. 5 is a sectional view taken along line 5—5 of FIG. 4.

As illustrated in FIGS. 1 through 6, a first embodiment of the invention comprises a connector block 10 having a front body member 12 and a rear body member 14 which are assembled as in FIG. 4 to form the rectangular block 10. The block includes top and bottom surfaces 16 and 18 defined by member 12, front and rear faces 20 and 22 and end faces 24 and 26. All of these surfaces are defined by the front body member 12.

Member 12 includes a circuit board receiving slot 28 extending longitudinally along front face 20 between the end faces 24 and 26 and extending into the block a substantial distance toward the rear face 22. Beveled lead-in surfaces 30 are provided in the slot at face 20 to facilitate insertion of a circuit board into the slot. A pair of ribbon cable-receiving slots 32 are formed in the rear face 22 of body member 12 and extend into the member from the rear face a distance beyond the bottom 34 of slot 28. Slots 32 are spaced in body 12 between the top and bottom surfaces 16 and 18 and the slot 28. As illustrated in FIG. 3, the portion of the member 12 surrounding slot 28 between the slots 32 defines a rearwardly facing nose 36. The end of the nose is spaced inwardly of rear face 22, so that the ends of the ribbon cable-receiving slots 32 adjacent rear face 22 join each other inwardly of the rear face to define a U-shaped opening 38 within the interior of body member 12. This opening surrounds nose 36.

Figure 6:
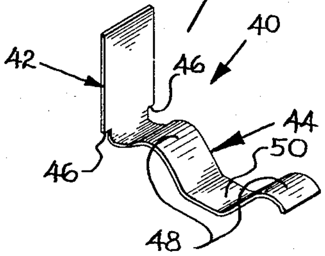
FIG. 6 is a perspective view of a contact used in the block.

As illustrated in FIG. 2, a row of metal contacts 40, shown in FIG. 6, is mounted in body member 12 along the length of the top and bottom surfaces 16 and 18. Each contact 40 includes a flat mounting portion 42 and a generally sinuous contact portion 44 which extends at right angles to one side of the mounting portion. Contact 40 is preferably stamp-formed from flat, uniform thickness sheet metal stock having desirable electrical conductivity and spring properties. The mounting portion 42 extends laterally beyond the edges of the contact portion 44 to define locating shoulders 46 at the junction between the portions. The contact portion includes a pair of spaced convex contact bows 48 facing away from the contact portion generally in the same direction as the mounting portion extends away from the contact portion. One bow 48 joins the mounting portion adjacent the shoulders 46 and flat contact portion 50 joins the bows.

Rows of contact mounting and inspection openings 52 extend along the length of the top and bottom of the body member 12 and communicate surfaces 16 and 18 with the slots 32. Similar rows of openings 54 extend along the length of the sides of nose 36 and communicate the circuit board-receiving slots with the adjacent ribbon cable-receiving slots 32. Each opening 54 is located in alignment with an opening 52 so that a number of openings extend from the top and bottom surfaces through member 12 to the circuit board-receiving slot 28. A pair of shoulders 56 are provided on opposite sides of such openings adjacent the front face 28 to define a pair of connector-receiving grooves 58 extending inwardly from the top or bottom surface of body member 12 to stops 60 adjacent the slot 28.

A metal contact 40 is positioned in each of the openings extending from a top or bottom surface of body 12 to the circuit board-receiving slot 28. The terminal is moved into the opening through opening 52 with the edges of mounting portion 42 located in grooves 58 and with the generally sinuous contact portion 44 extending toward the rear face 22. The contact is seated in the opening with shoulders 46 abutting stops 60 and with the contact portion 42 generally positioned within opening 54 as illustrated in FIG. 3. The crests of the contact bows 48 project outwardly of the sides of nose 36 and the connecting portion 50 extends slightly into slot 28. Shoulders 46 and stops 60 assure accurate location of the contacts 40 in the body member 12.

Figure 1:
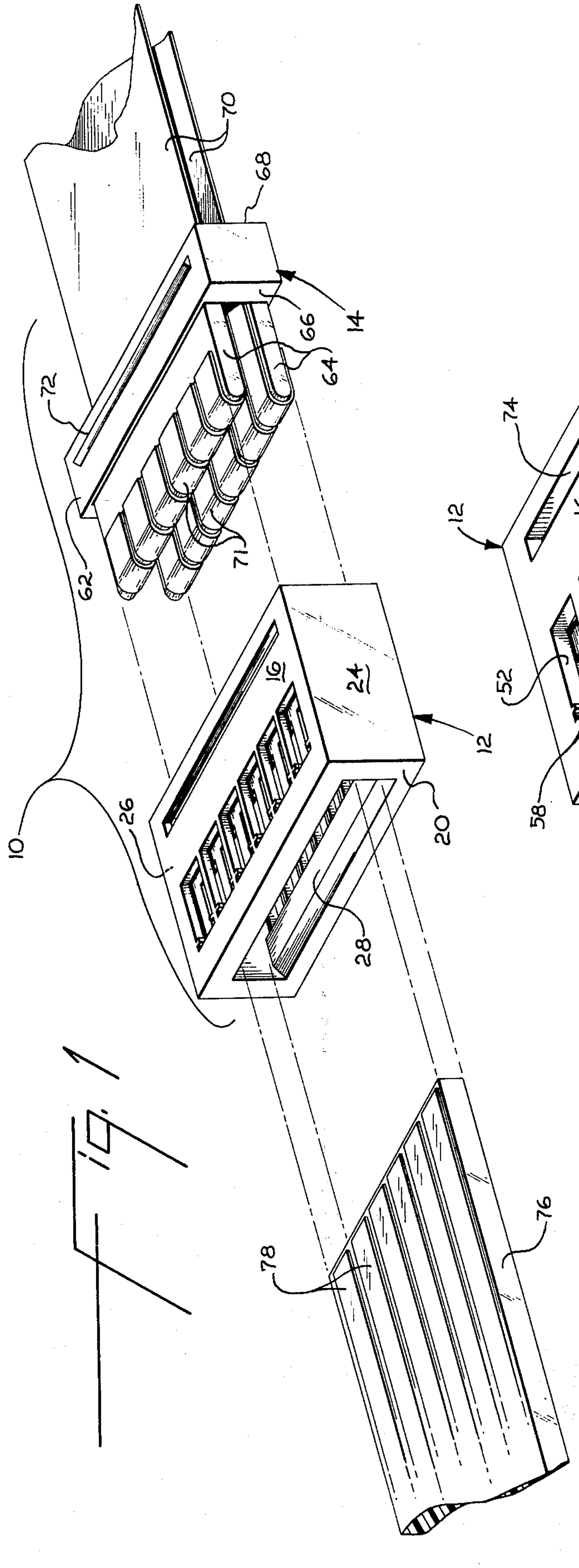
FIG. 1 is a perspective view of a connector block according to the invention used to form electrical connections between spaced contacts on both sides of an edge of a circuit board and exposed conductors on two flat, flexible cables.

As best illustrated in FIGS. 1 and 4, the rear body portion 14 of connector block 10 includes an elongate base 62 dimensioned to fit snuggly within the bight portion of the U-shaped opening 38 in front body member 12. A pair of longitudinally extending spaced noses 64 project outwardly from the front face 66 of base 62 and extend longitudinally along the base a distance slightly less than the longitudinal extent of the slots 32 in the front body member. As illustrated in FIG. 3, noses 64 are spaced apart from each other to fit within the slots 32, upon assembly of the two body members 12 and 14.

A pair of ribbon cable-receiving slots 66 extend through the thickness of the rear body member at the interior junctions between the noses and the base from rear face 68 to front face 66. The ends of flat conductor ribbon cables 70 are extended through such slots from base rear face 68 and are wrapped tightly around the respective noses 64 with the cable end secured to the nose. The individual ribbon conductors 70 in the cables are exposed at the adjacent surfaces of the noses for forming electrical connections with the contacts 40 in the block.

Following mounting of the ribbon cables 70 on the rear body member 14, the body members are assembled by inserting the rear body member into the U-shaped cavity within the front body member. Noses 64 extend into slots 32 and the exposed contact surfaces of the individual ribbon conductors of the cable engage the contact bows 48 of the metal contacts 40 held in the front member and, with further assertion, flex the contact portions toward the circuit board-receiving slot 28. The contact pressure exerted on the exposed ribbon conductors of cable 70 is insufficient to injure the relatively delicate conductors. The spring resilience of the metal contacts permits flexing of the contact portions. When the rear member 14 is fully seated in opening 38, latching projections 72 snap into the recesses 74 in the top and bottom of the front body member to secure the two members together. Both members 12 and 14 are preferably formed of somewhat resilient insulating material, such as a molded plastic, and are sufficiently deformable to permit flexing during assembly.

After the two body members have been assembled as in FIG. 4, a circuit board 76, or like planar member, having a row of spaced electrical contact pads 78 arranged at intervals along each side at one edge thereof is inserted into the circuit board-receiving slot 28 so that each pad 78 engages the connecting portion 50 of a contact 40. Such portions extend into the slot 28 further than indicated in FIG. 3 due to engagement between the crests 48 and the conductors wrapped around noses 64. The flat connecting portions slope away from the entrance of slot 58 so that insertion of the circuit board 76 progressively stresses the contact portions 44 to stress the same and form a high pressure electrical interconnection between the pads 78 and the conductors 71 of cables 70. As the metal contact portions 44 are collapsed by insertion of the circuit board, the crest 48 away from mounting portion 42 is extended slightly toward the rear of the block 10 to form a desired wiped connection with the conductors 71. Fitting of the circuit board 76 into slot 28 is facilitated by the beveled lead-ins 30 at the mouth of the slot. When fully inserted, the edge of the board engages the bottom 34 of the slot.

The two-step assembly of block 10 assures that the relatively delicate conductors of the ribbon cable are not injured when they are secured to the block and when brought into engagement with the crests of the metal contacts. A wiped, flush connection is formed between the connecting protions 50 and pads 78. If desired, conductive coatings may be applied to the contacting portions of the contacts 40 to enhance the electrical properties of the interconnections between the ribbon cable conductors and pads. The ends of contact mounting portions 42, located below the respective top and bottom surfaces of the block and may be contacted by test probes for circuit diagnostic purposes without injury to either the ribbon cable conductors 71 or the circuitry on board 76. Such probe contact does not effect the electrical interconnection between the printed circuitry and pads as provided by the generally sinuous contact portion 44.

In the assembled block 10, each ribbon cable 70 extends along an interface 75 between the block members which includes a laterally offset portion so that the cables are bent through first a shallow bend in one direction and then a shallow bend in the opposite direction. After the second shallow bend, the cable extends in the same direction it extended in prior to the first bend. The cable is tightly confined between the surfaces at the interface while passing through the two bends to secure the cable to the block and to isolate the portion of the cable wrapped around nose 64 from the portion of the cable extending outwardly of the block and prevent stresses on the exposed portion from stressing the portion on the noses. The two slight bends at the interface 75 are sufficient to provide the desired stress relief of the delicate cable and thus assuring that short circuits or conductors ruptures do not occur within the block.

The pair of openings 52 and 54 in the body member 12 permits the metal contacts 40 to be moved past the top and bottom surfaces 16 and 18, through the slots 32 and into the interconnecting openings 54 between such slots and the circuit board-receiving slot 28. During this operation, the metal mounting portions of the terminals are seated into the retaining grooves 58 to secure the contacts in place. In addition to permitting mounting of the terminals between the circuit board and ribbon cable-receiving grooves, the openings 52 permit visual inspection of the conductors wrapped around the noses 64 to assure proper alignment of the conductors before insertion of the circuit board 76. In this way, short circuits formed because metal contacts engage two conductors on the cable may be eliminated.

FIGS. 7, 8, and 9 illustrate a second embodiment of the invention comprising a connector block 80 having front and rear body members 82 and 84. The front body member 82 includes a front face 86, a nose 88 extending longitudinally along the length of the front face and rearwardly from the front face a distance between end walls 90 and 92. A circuit board-receiving slot 94 extends from the front face 86 into nose 88 to a bottom surface 96. A row of contact-receiving openings 98 extend along the length of each side of the nose 88 and communicate the circuit board slot 94 to the space to either side of the nose. Metal contacts 100, similar to contacts 40 shown in FIG. 6, are mounted in body member 82 in a manner as described in connection with the connector block 10, and include generally sinuous contact portions 102 positioned in openings 98 similar to the contact portions 44 of the contacts 40. As shown in FIG. 7, the width of end wall 92 is greater than that of end wall 90 and extends beyond the upper and lower surfaces of the front face 86. The upper and lower surfaces of end wall 90 are flush with the upper and lower surfaces of the front face. Longitudinally extending latching projections 104 run along the top and bottom of the front body member, adjacent the front surface 86.

The rear body member 84 includes a base 106, a pair of spaced longitudinally extending and cable-receiving noses 108 extending away from the front of the base, and a pair of spaced cover plates 110 spaced outwardly of noses 108. Cable-retaining projections 112 extend from the cover plates toward the adjacent noses 108 to facilitate holding the end of the cable in place during mounting on the nose. Longitudinal cable-receiving slots 114 extend through the thickness of the rear body member adjacent the junction between the base and noses for reception of the flat conductor ribbon cables 116 which are secured to the noses. The cover plates 110 extend longitudinally beyond the ends of the noses at the end of the rear body member adjacent end wall 90 of the front body member.

The flat conductor ribbon cables 116 are secured to the rear body member by extending a length of cable through each of the slots 114 and positioning the end of the cable between the cable-retaining projections 112 and the adjacent nose 108. Cover plates 110 may be flexed outwardly slightly to facilitate this operation. The conductors in the cable portions wrapped around the noses are exposed for engagement with the contact portions 102 upon assembly of the two body members. With the cables thus secured to the rear body member, the member is mounted on the front body member by moving the members together so that the nose 88 is fitted within the space between the cable holding noses 108. The individual ribbon cable conductors engage the contact portions 102 during this operation in the same manner as described in connection with the assembly of connector block 10. When the assembly is completed, the ends of the cover plates 110 extend to the front surface 86 of the front body member and the latching members 104 snap into longitudinally recesses 118 in the cover plates to secure the members together. As with body members 12 and 14 of block 10, the body members 82 and 84 of block 80 may be formed of slightly resilient insulating materials to permit flexing of the cover plates during both attachment of the ribbon cables 116 to noses 108 and assembly of the two body members. After assembly has been completed, a circuit board 120 may be positioned in circuit board-receiving slot 94 in a manner as previously described so that the contact portions 102 form an electrical interconnection between the exposed conductors of the ribbon cables 116 and adjacent contact pads on the board. If desired, the recesses 118 may be cut back slightly further from the front face of the block to permit contact probes to engage the mounting portions of the metal contacts 100 for circuit diagnostic purposes. The extension of the cover plates 110 to one side of the rear body member rest flush on the top and bottom of end wall 90 of the front body member while the edges of the cover plates at the other side of the rear body member abutt against front body member end wall 92. In this way, the two members may be assembled in only one position, thus assuring that the appropriate ribbon cable 116 is in electrical connection with contact pads on the appropriate side of the circuit board 120. A similar polarizing device may be provided in block 10. For instance, one nose 64 may be slightly longer than the other nose 84 and its respective slot 32 would be slightly longer than the remaining slot 32 for the other, shorter nose. While both of the connector blocks 10 and 80 described herein connect the conductors of a pair of ribbon cables to contact pads on both sides of a circuit board, or similar member, it is contemplated that a connector block within the purview of the invention may be used for forming electrical connections between but one ribbon cable and contact pads on one side of a circuit board or similar member.

While I have illustrated and described preferred embodiments of my invention, it is understood that these are capable of modification, and I therefore do not wish to be limited to the precise details set forth, but desire to avail myself of such changes and alterations as fall within the purview of the following claims.

I claim:

1. A connector block comprising a body having front and rear body members both formed of insulating material; the front body member having spaced front and rear faces, an elongate circuit board-receiving slot extending along the front face and into the front body member a distance from the front face, a circuit board nose surrounding said circuit board-receiving slot and facing away from said front face, the nose including a pair of side walls extending along the slot, and a plurality of contact-receiving openings extending through the thickness of the side walls at intervals along the length thereof; the rear body member including an elongate base extending along the end of the nose of the front body member when the members are assembled, a pair of spaced ribbon cable-receiving noses extending from said base toward the front surface and along the outer surfaces of said side walls, such noses including cable support surfaces overlying the openings in the adjacent side walls, and means for securing a flat cable on each such nose with exposed conductors in the cable on the respective cable support surfaces and facing the openings in the adjacent side walls; and a plurality of metal contacts each located in one of said openings, mounting means attached to each contact for securing the contact to the front body member, each contact including a surface facing toward the adjacent ribbon cable-receiving nose for engaging an exposed conductor in the cable on the adjacent ribbon cable-receiving nose and a circuit board pad engaging surface facing toward the circuit board-receiving slot for engaging a pad on a circuit board positioned in such slot; and means for securing said front and rear body members together with the end of the circuit board nose positioned adjacent said base so that when a flat cable with exposed conductors is mounted on each ribbon cable-receiving nose and a circuit board or like member is inserted into the circuit board-receiving slot, said contacts form electrical interconnections between contact pads on both sides of the circuit board and the cable conductors.

2. A connector block as in claim 1 wherein said body includes top and bottom walls located to either side of the circuit board nose with the ribbon cable-receiving noses located between such walls and the circuit board nose.

3. A connector block as in claim 2 including a plurality of openings extending through the thickness of said top and bottom walls at intervals along the length thereof, each such opening being located above one of the contact-receiving openings in one of the circuit board nose side walls so that said contacts may be moved through the openings in the top and bottom walls prior to being secured to the front body member in the openings in the nose side walls.

4. A connector block as in claim 3 wherein said top and bottom walls join said front body member.

5. A connector block as in claim 1 wherein each contact includes a generally sinuous contact portion and a mounting portion having a shoulder, said front body member including slot means for receiving the mounting portion with a stop for engagement by said shoulder whereby the mounting portion is moved into the slot means during positioning of the contact into its respective opening and final location of the contact member within the opening is determined by engagement between the shoulder and the stop.

6. A connector block as in claim 1, including ribbon cable-receiving slots in said rear body member adjacent said ribbon cable-receiving noses and means for forming stress relief connections between the ribbon cable on each such nose and the body, such means tightly engaging the cable and holding the cables in the body with a pair of shallow bends in each cable.

7. A connector block as in claim 6 wherein said stress relief connection means includes a surface on each of said body members, such surfaces being engagable with said cables to impart said bends into the cables and tightly sandwich the cables therebetween.

8. A connector block comprising a body having front and rear body members both formed of insulating material; the front body member having spaced front and rear faces, an elongate circuit board receiving slot extending along the front face and into the front body member a distance from the front face, a nose surrounding said circuit board receiving slot and facing away from said front face, the nose insluding a side wall extending along the slot, and a plurality of contact-receiving openings extending through the thickness of the side wall at intervals along the length thereof; the rear body member including an elongate base extending along the nose of the front body member when the members are assembled, a ribbon cable-receiving nose extending from said base toward the front surface and along the outer surface of said side wall, such nose including a cable support surface overlying the openings in the adjacent side wall, and means for securing a flat cable on such nose with exposed conductors in the cable on the cable support surface and facing the openings in the adjacent side wall; and a plurality of metal contacts each located in one of said openings, mounting means attached to each contact for securing the contact to the front body member, each metal contact being generally sinuous in shape and including a pair of contact crests both facing either toward or away from the circuit board-receiving slot for engagement with either a circuit board pad or a cable connector and a surface located between said crests and engagable with the other of said circuit board contact pad or cable conductor; and means for securing said front and rear body members together with the end of the circuit board nose positioned adjacent said base so that when a flat cable with exposed conductors is mounted on the ribbon cable-receiving nose and a circuit board or like member is inserted into the circuit board-receiving slot, said contacts form electrical interconnections between contact pads on the circuit board and the cable conductors.

* * * * *